United States Patent [19]

Kasser et al.

[11] Patent Number: 5,790,107
[45] Date of Patent: Aug. 4, 1998

[54] TOUCH SENSING METHOD AND APPARATUS

[75] Inventors: Bernard Kasser, Menlo Park; Bernhard Joss; Stephen J. Bisset, both of Palo Alto, all of Calif.

[73] Assignee: Logitech, Inc., Fremont, Calif.

[21] Appl. No.: 478,290

[22] Filed: Jun. 7, 1995

[51] Int. Cl.$^6$ ............................................. G08C 21/00
[52] U.S. Cl. ............................ 345/174; 345/161; 178/18
[58] Field of Search .................................. 345/160, 161, 345/174, 179; 377/12; 177/210 C; 178/18–20

[56] References Cited

U.S. PATENT DOCUMENTS

| | | |
|---|---|---|
| 3,921,166 | 11/1975 | Volpe . |
| 4,091,234 | 5/1978 | Bristow ............................. 178/18 |
| 4,103,252 | 7/1978 | Bobick . |
| 4,455,452 | 6/1984 | Schuyler . |
| 4,550,221 | 10/1985 | Mabusth . |
| 4,639,720 | 1/1987 | Rympalski et al. . |
| 4,686,332 | 8/1987 | Greanias et al. . |
| 4,733,222 | 3/1988 | Evans . |
| 4,736,191 | 4/1988 | Matzke et al. . |
| 5,006,952 | 4/1991 | Thomas ............................. 361/283 |
| 5,016,008 | 5/1991 | Gruaz et al. . |
| 5,374,787 | 12/1994 | Miller et al. ............................. 178/18 |

FOREIGN PATENT DOCUMENTS

| | | |
|---|---|---|
| 55-149811 | 11/1980 | Japan . |
| WO 91/03039 | 3/1991 | WIPO . |

OTHER PUBLICATIONS

Synaptics Brochure, "Synaptics Touch Pad," pp. 1–39.

*Primary Examiner*—Jeffrey Brier
*Attorney, Agent, or Firm*—Townsend and Townsend and Crew LLP

[57] ABSTRACT

Method and apparatus for determining small variations in capacitance, typically in a capacitive touch sensing device, includes a reference signal of a first frequency and a sample signal of a second frequency. The reference and sample signals are mixed and filtered to isolate the beat frequency therebetween, which is then measured to provide an indication of the variation in the sample frequency. The measurement can then be manipulated by a microprocessor or microcontroller to provide desired control signals. The apparatus is susceptible of digital implementation and single chip implementation.

18 Claims, 7 Drawing Sheets

TOUCH SENSING METHOD AND APPARATUS

FIELD OF THE INVENTION

The present invention relates generally to capacitive touchpad devices, and more particularly relates to touchpad devices which detect minute variations in capacitance through the use of beat frequencies. Both method and apparatus are disclosed.

BACKGROUND OF THE INVENTION

Touch sensing devices are well known, and take a number of different forms. Perhaps the best known are resistive-membrane position sensors, which have been used in a number of different applications for many years. Such devices have been used as keyboards, position indicators, etc. However, such devices require finger pressure, may have relatively high power consumption, wear out relatively quickly, and require repeated pressing to register an event.

Other types of touch sensing devices include resistive tablets, surface acoustic wave devices, touch sensors based on strain gages or pressure sensors, and optical sensors. Each has a number of drawbacks, which vary among high power consumption, low resolution, high wear, high cost, sensitivity to artifact signals, sensitivity to dirt or other accumulation, or others. As a result, another touch sensing technology which has been considered is capacitive sensing, in which the location of a finger (or in some instances another object such as a stylus) over a sensing device is determined by virtue of variations in capacitance under and around the location of the finger. A touch screen, in which the capacitance from the finger through an insulator to a resistive film is sensed, is one approach but requires grounding. Another form of capacitive sensing employs a capacitive matrix having row and column electrodes. The finger, when placed over the matrix, changes the transcapacitance between row and column electrodes. Still another approach employs four oscillating signals to interpolate x and y positions between four capacitive electrodes. Yet another approach uses a capacitive tablet wherein the finger accentuates the capacitive coupling between electrodes.

It is also known to use a capacitive tablet wherein the effective capacitance to "virtual ground" is measured by an oscillating signal. Each row or column is polled sequentially, and a rudimentary form of interpolation is applied to resolve the position between two rows or columns. The problem of contamination is addressed by sensing when no finger is present, and applying a periodic calibration during such no-finger-present periods. A variation of this approach, also known in the art, is the use of a tablet for sensing the position of a stylus. The stylus alters the transcapacitance coupling between row and column electrodes, which are scanned sequentially. A somewhat different, but related, approach uses a radial electrode arrangement under the space bar of a keyboard, to be activated by touching with a thumb. This approach detects total touch capacitance, as an indication of the touch pressure, to control the velocity of cursor motion. Pulsed sequential polling is employed to address the effects of electrical interference.

Other stylus-oriented approaches are also known. One use teaches a stylus and finger detection system meant to be mounted on a CRT. As a finger detection system, its XN sensor matrix is used to locate the two matrix wires carrying the maximum signal. With a coding scheme, these two wires uniquely determine the location of the finger position to the resolution of the wire stepping. For stylus detection, a first coarse location is initially detected, and then a virtual dipole is developed by driving all lines on one side of the object in one direction and all lines on the opposite side in the opposite direction. This is done three times with different dipole phases and signal polarities. Assuming a predetermined matrix response to the object, the three measurements present a set of simultaneous equations that can be solved for position.

It is also known to use a capacitance touch measurement system that interpolates to a high degree. In one approach, a three terminal measurement system is employed that uses a drive, sense and electrode signal set (3 signals) in its matrix, and bases the measurement on the attenuation effect of a finger on the electrode node signal using a capacitive divider phenomena. A sequential scan through each drive set is used to measure the capacitance. From the three largest responses an interpolation routine is applied to determine finger position. A zeroing technique is also used that allows "no-finger" levels to be canceled out as part of the measurement.

A touch sensitive pad that also uses interpolation is also known in the art. One such device uses a drive and sense signal set (2 signals) in the touch matrix and relies on the attenuation effect of a finger to modulate the drive signal. The touch matrix is sequentially scanned to read each matrix lines response. An interpolation program then selects the two largest adjacent signals in both dimensions to determine the finger location, and ratiometrically determines the effective position from those four numbers.

Still another prior art approach to a touch pad system applies an oscillating potential of a given frequency and phase to all electrodes on one side of the virtual dipole, and an oscillating potential of the same frequency and opposite phase to those on the other side. Electronic circuits develop a "balance signal" which is zero when no finger is present, and which has one polarity if a finger is on one side of the center of the virtual dipole, and the opposite polarity if the finger is on the opposite side. To acquire the position of the finger initially, the virtual dipole is scanned sequentially across the tablet. Once the finger is located, it is "tracked" by moving the virtual dipole toward the finger once the finger has moved more than one row or column. This approach is complicated, and not readily susceptible of the low cost manufacture required in today's computer marketplace.

In certain prior art, a position sensing system includes a position sensing transducer comprising a touch-sensitive surface disposed on a substrate, such as a printed circuit board, including a matrix of conductive lines. A first set of conductive lines runs in a first direction and is insulated from a second set of conductive lines running in a second direction generally perpendicular to the first direction. An insulating layer is disposed over the first and second sets of conductive lines. The insulating layer is thin enough to promote significant capacitive coupling between a finger placed on its surface and the first and second sets of conductive lines. Sensing electronics respond to the proximity of a finger to translate the capacitance changes of the conductors caused by finger proximity into position information on a display. The output of the sense electronics is typically a finger profile, which can then be manipulated by a suitable microcontroller and firmware to provide as an output a simple X, Y value.

While such devices offer promise in certain applications, price performance issues continue to limit their desirability. Further, each of the prior art devices uses analog signal processing for a substantial portion of the circuitry.

There has therefore been a need for a sensing device which performs sensing simply, inexpensively and rapidly, while at the same time avoiding problems with moisture, cost and pressure variation. There has also been a need for a sensing device which facilitates conversion to digital processing as quickly as possible, as well as permitting a higher degree of integration than has previously been possible.

SUMMARY OF THE INVENTION

The present invention provides a novel method and apparatus for sensing the proximity of a finger to a touch sensor. In an exemplary embodiment, a capacitive touch sensor is used, such that the proximity of the finger causes small changes, on the order of one percent, in capacitance of the sensor. The capacitance of the sensor is combined with other components to comprise a sample oscillator where the frequency of the sample oscillator varies with the change in capacitance of the sensor.

In addition to the sample oscillator, a reference oscillator is provided. The reference oscillator is adjusted to a predetermined frequency suitably close to the frequency range of the sample oscillator. The outputs of the reference oscillator and sample oscillator are then mixed, and the resulting signal is filtered by a low pass filter to isolate the beat frequency between the two signals.

The beat frequency is then measured, which provides an indicia of the change in capacitance caused by the proximity of the finger. However, in a typical embodiment the response of the measurement circuit is substantially nonlinear, which offers the desirable feature of providing substantially the same sensitivity to both light and heavy touch. In such an arrangement, an exemplary embodiment of the invention has been shown to work well when the frequency ($f_R$) of the reference oscillator is set at approximately 500 KHz while the frequency ($f_s$) the sample oscillator is set at approximately 495 KHz to provide a beat frequency such that a count of about two hundred is measured when no finger is present, and to provide a count of about fifty when a finger is present on the traces with maximum coupling.

The frequency of the reference oscillator (and the associated sample frequency) may be varied over a substantial range, depending on what represents an acceptable trade-off between resolution, emissions and power consumption. In practical terms, the trade-off can be analyzed in terms of needing to resolve a relatively small change in capacitance, on the order of one to ten percent, into a given number of bits of resolution, such as seven bits, over a limited time.

With the present invention, one such measurement resolves the one percent change in capacitance to about seven bits while taking only about 250 µs. Resolving such a small change in capacitance by prior art methods such as direct frequency counting would take about nine milliseconds at the same frequency, or would require an operating frequency on the order of 50 MHZ if made in the same 250 µs.

In addition, the output of each of the oscillators is preferably, though not necessarily, a sawtooth in at least some embodiments. In at least the exemplary embodiment described hereinafter, a sawtooth is preferred for noise rejection. Likewise, in the exemplary embodiment a duty cycle of about fifty percent is preferred, though not required in all embodiments. In addition, an asymmetrical oscillator output may be used, although in some instances it may be coupled with a frequency divider such as a "divide by two."

The present invention is particularly well suited to use with capacitive touchpads for cursor control and related touch sensing devices, at least partly because it achieves good resolution, light touch operation, and good finger tracking reasonably quickly and at relatively low expense. In an exemplary implementation, the capacitive touchpad comprises part of the sample oscillator. The touchpad will typically comprise a plurality of traces as are well known in the art. Each trace is sensed by incorporating the trace into the remainder of an oscillator circuit. In some embodiments each trace may have a different oscillator circuit associated with it, in others embodiments, a multiplexer or other switching arrangement may be used to connect each trace to the remainder of the oscillator circuit.

Whichever arrangement is used, the output of the sample oscillator and reference oscillator are mixed and filtered to leave only a pulse train representative of the beat frequency between the sample and reference oscillators. In some embodiments the pulse train may be filtered again to protect against noise. Whether further filtered or not, the frequency of the pulse train may then be measured to provide a digital representation of the variation in capacitance. When combined with the counts from each of the other traces, a finger profile can be developed, which may be used to determine finger position either by calculation of a centroid or through other suitable algorithms to provide X, Y cursor control signals or other control signals. The finger position information can then be communicated to the host. In addition, while a typical embodiment measures capacitance changes, the method of the present invention may also be used to measure quickly small variations of any element which can affect the frequency of an oscillator.

The present invention also has the advantage of being readily implemented in a highly integrated form, and in some embodiments may be implemented in a single ASIC. This is due, in part, to the highly digital nature of the design, whereas the prior art includes a substantial number of analog elements. In addition, the invention makes possible the implementation of capacitive devices other than touchpads, such as joysticks or other pointing devices.

It is therefore one object of the present invention to provide a method and apparatus for detecting small variations in capacitance by use of a beat frequency.

It is a further object of the present invention to provide a method for converting variations in capacitance into digital counts.

It is yet a further object of the present invention to provide method and apparatus for detecting small variations in a predetermined indicia to indicate the presence of a finger or other object near a sensing device.

Another object of the present invention is to provide method and apparatus capable of resolving small percentage changes in capacitance to seven bits over a limited time.

A still further object of the present invention is to provide a touch sensing device having all of its electronics capable of implementation in a single integrated circuit.

Yet a further object of the present invention is to provide a touch sensing method and apparatus capable of substantially digital implementation.

Yet another object of the present invention is to provide a capacitive joystick in which capacitance changes indicate direction of motion.

These and other objects of the present invention may be better appreciated from the following detailed description of the invention, taken together with the appended Figures described below.

DETAILED DESCRIPTION OF THE INVENTION

Figure 1:
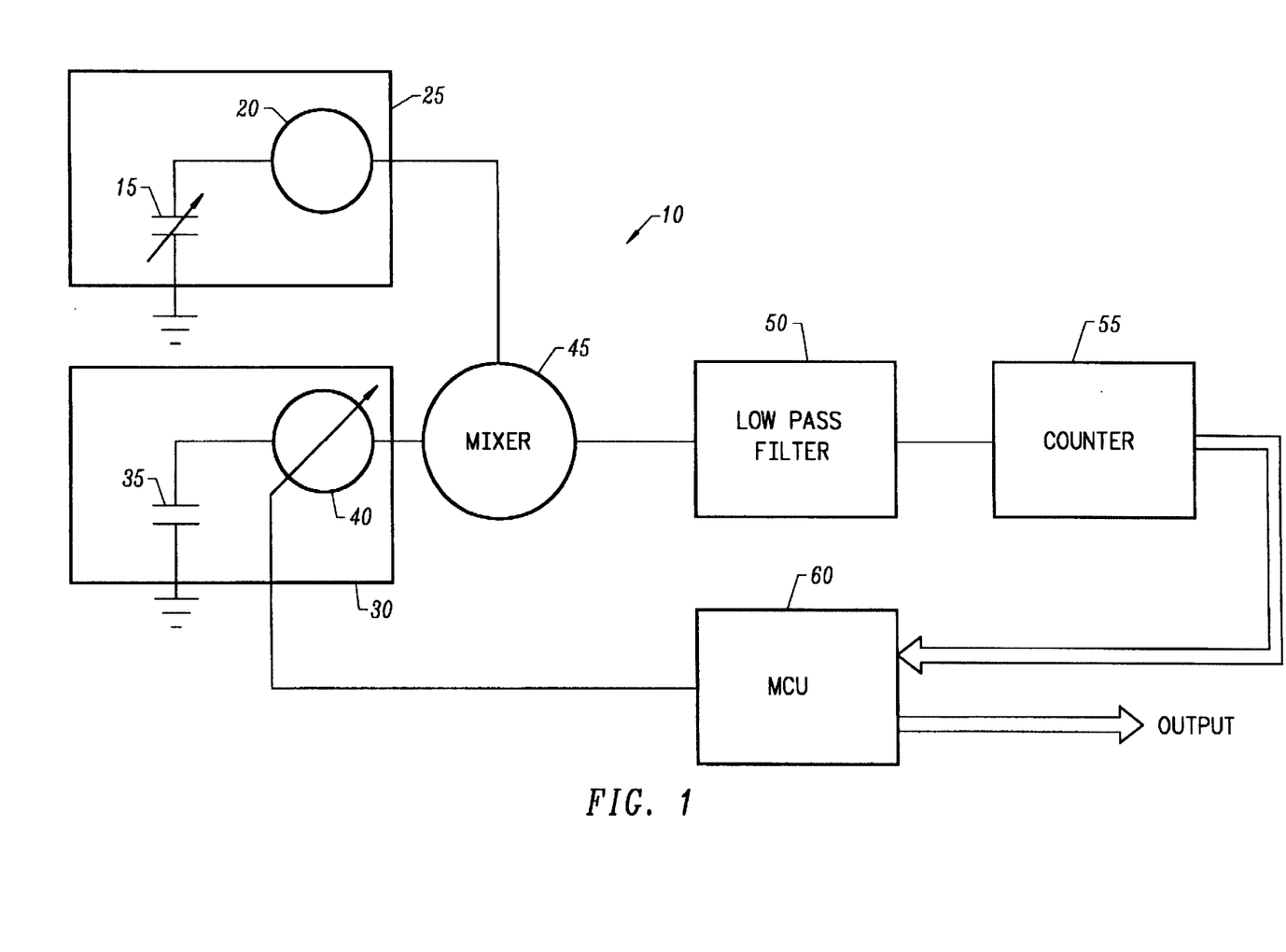
FIG. 1 shows in schematic block diagram form a generalized implementation of the present invention.

Referring first to FIG. 1, a generalized view of a touch sensing device according to the present invention is shown in schematic block diagram form. A touch sensing device 10 includes a sensor 15, which is combined with other logic 20 to form a sample oscillator 25. In an exemplary embodiment, the sensor 15 is a capacitive sensor, such that the sensor 15 may be represented as a capacitance $C_{MEAS}$, although other forms of sensors may be used in some embodiments.

In an exemplary embodiment, a reference oscillator 30 is also provided, and is adjusted to have a frequency relatively close to the frequency of the sample oscillator 25. While not necessary in all embodiments, in at least some embodiments the reference oscillator 30 will include a reference capacitance 35 together with other elements 40. The use of a reference capacitance 35 offers compensation for temperature drift in at least some instances.

The outputs of the sample oscillator 25 and reference oscillator 30, each of which is typically—though not necessarily—a sawtooth waveform, are mixed in a mixer 45, the output of which is then provided to a low pass filter 50 to eliminate the higher harmonics. The output of the filter 50 provides a signal representative of the beat frequency between the sample oscillator 25 and reference oscillator 30, which may then be measured in a frequency counter 55.

It will be appreciated by those skilled in the art that a change in the value of the sensor 15 will cause a change in the frequency of the sample oscillator 25. This, in turn, will cause a change in the beat frequency which appears at the output of the low pass filter 55. As a result, the count registered in the counter 55 will reflect the change in value of the sensor 15, such as a change in the value of the capacitance $C_{MEAS}$ which indicates the presence or absence of a finger or other object near the sensor 15. In a typical embodiment, a small change in the frequency of the sample oscillator 25 (on the order of one percent) will cause a much greater percentage change in the count measured by the counter 55, on the order of seventy-five percent.

The output of the frequency counter 55 may then be provided to a microcontroller or microprocessor 60 for further processing. In some instances, such as that discussed hereinafter in connection with FIG. 2, the count from the counter 55 may be combined with other measurements in the microprocessor 60 to form a finger profile and X-Y cursor data. Alternatively, the output of the counter 55 may be used by the processor 60 to control other events, such as switching or other signaling. In addition, the microcontroller 50 may provide calibration signals on a line 65 to the reference oscillator 40 based at least in part on the count from the counter 55.

In an exemplary embodiment, the value of $C_{MEAS}$ may be in the range of 10–30 picofarads or more, although in a more general implementation the value of $C_{MEAS}$ may vary between one and one hundred or more picofarads or, in some applications (particularly non-touchpad applications), even into the microfarad range. The change in capacitance representative of the presence of a finger or other object in a touchpad application may be on the order of a one to ten percent, while in an exemplary embodiment the frequency of the oscillators 25 and 30 may be adjusted to be on the order of 500 KHz. At this frequency, a one percent change in capacitance can be resolved to seven bits over an acceptably short period, while at the same time maintaining acceptably low power consumption and avoiding unacceptably high emissions. In a touchpad application in which the traces are scanned sequentially, a suitably short period may be on the order of thirty milliseconds or less for a scan of all traces, while in a pen application a suitably short period may be on the order of ten milliseconds or less for a full scan.

Figure 2:
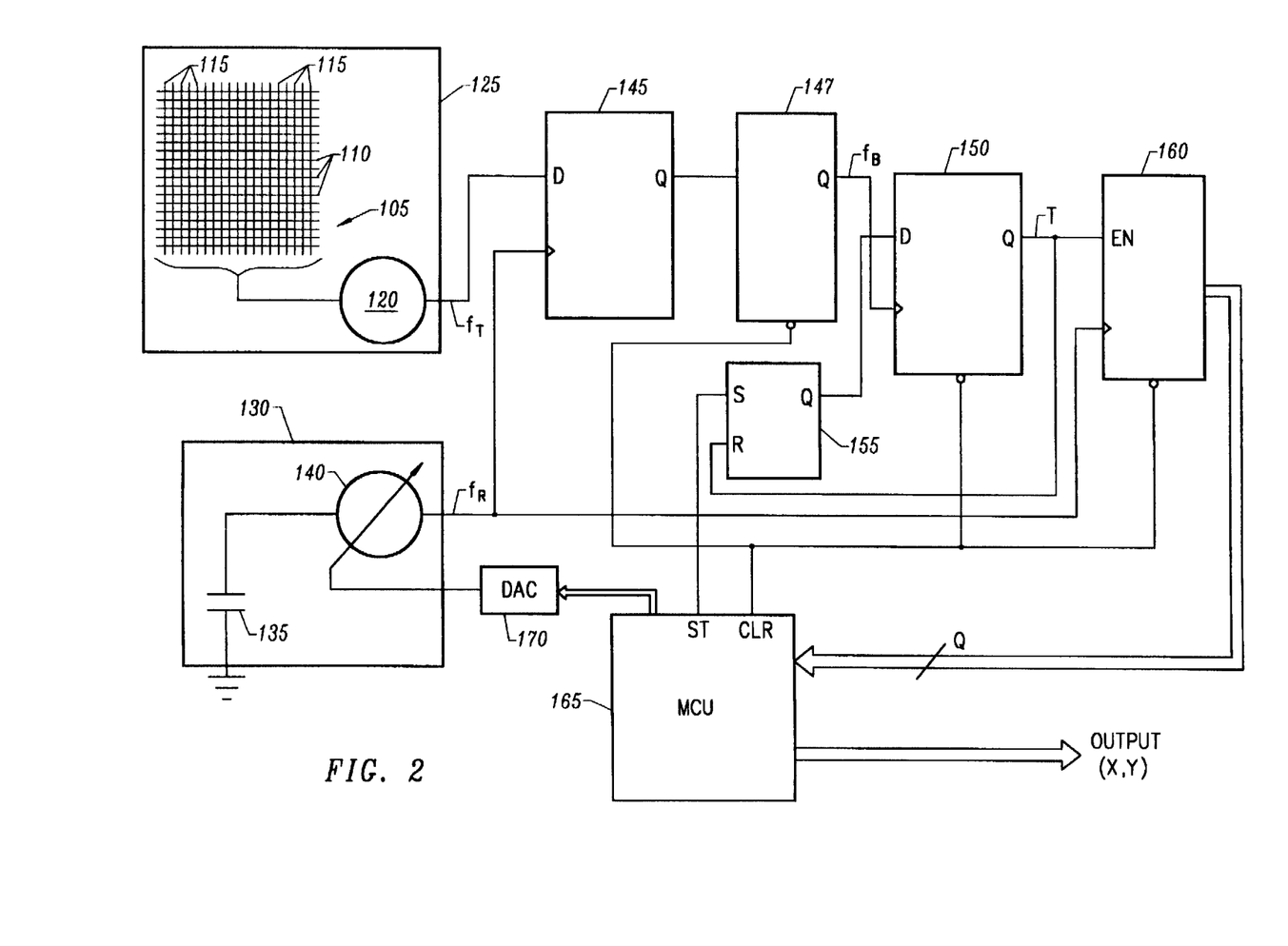
FIG. 2 shows in schematic block diagram form an implementation of the present invention particularly suited to use with a touch pad.
Figure 3:
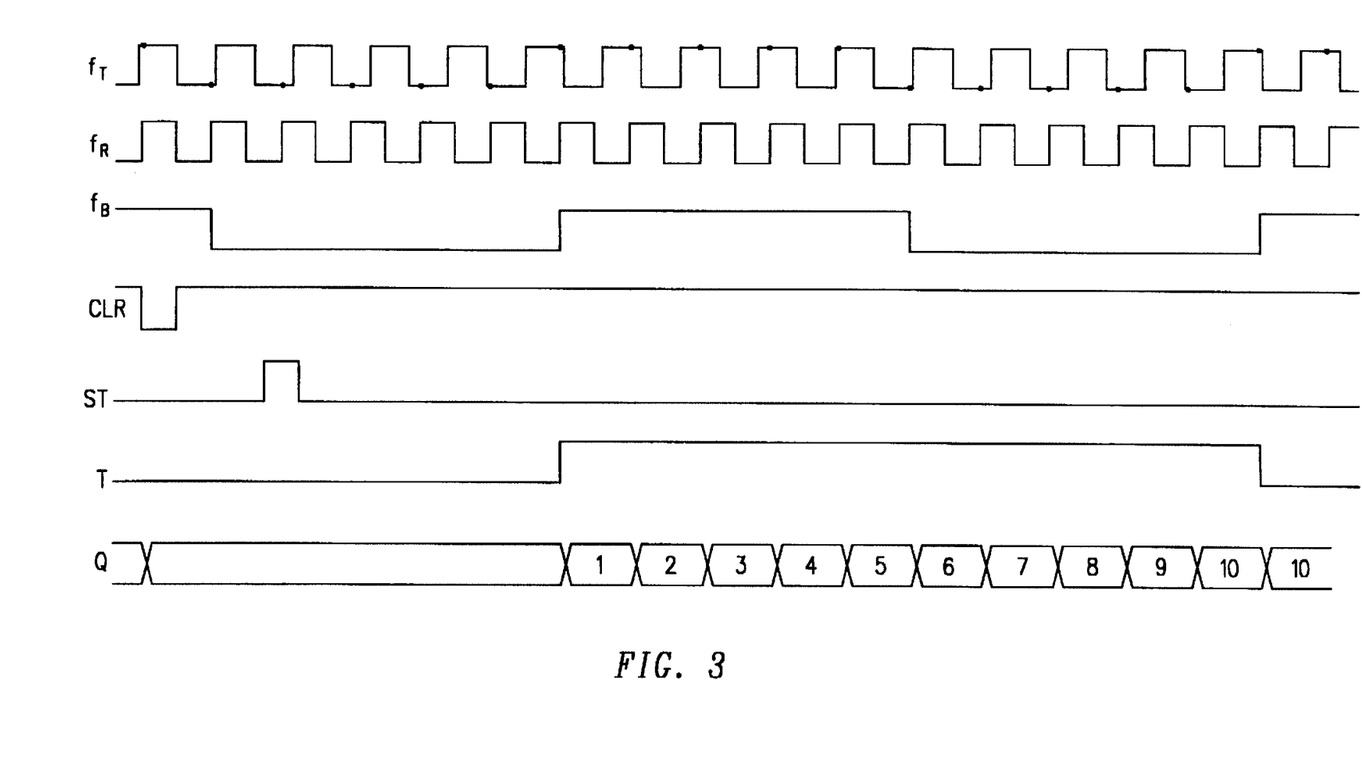
FIG. 3 is a timing diagram illustrating the operation of the circuit of FIG. 2.

An exemplary implementation of the present invention as a capacitive touchpad useful for X-Y cursor control in computers may be appreciated from FIG. 2. To better understand the operation of the circuit of FIG. 2, FIG. 3 is a timing diagram for key points in FIG. 2. A sensor 100, which generally may be a capacitive touchpad of the type described in U.S. patent application Ser. No. 08/321,987 [entitled Touchpad Sensor with Simultaneous Sensing, filed 12 Oct. 1994 and assigned to the assignee of the present invention, the relevant portions of which are incorporated by reference], includes a series of traces 105 arranged in rows 110 and columns 115. Each of the traces 105 may, for example, be connected (either sequentially or otherwise) to other components 120, shown in greater detail in FIG. 6, to operate cooperatively as a sample oscillator 125. The output of the oscillator 125 is preferably a sawtooth (for optimal noise rejection) with a frequency fT, as shown at the top of FIG. 3. Similar to the arrangement shown in FIG. 1, a reference oscillator 130 comprised in an exemplary arrangement of a fixed reference capacitance 135 together with other components 140, again as shown in greater detail in FIGS. 6A–6B. The output of the reference oscillator 130 is also a sawtooth, but with a frequency $f_R$. The waveform of the signal $f_R$ is also shown in FIG. 3. In an alternative embodiment, it is possible to replace the reference oscillator with a second sample oscillator 125, in which case the change in capacitance between traces is measured. In such an arrangement, the two traces being sampled typically would not be adjacent.

In the exemplary embodiment of FIG. 2, the output of the oscillator 125 is provided to the D input of a D flip-flop 145. The output of the reference oscillator 130 provides the clock input to the flip-flop 145. The D flip-flop provides both the mixing and low pass filtering functions shown in FIG. 1, and thus represents an elegantly simple implementation. The mixed and filtered signal is taken at the non-inverting output of the flip-flop 145, and is shown in simplified form as signal $f_B$ in FIG. 3. The non-inverting output (Q) is supplied to the input of an optional digital filter 147, which provides waveshaping functions and eliminates unwanted transients that may exist in some embodiments at the output of flip-flop 145. The non-inverting output of the filter 147 is provided to the clock input of a D flip-flop 150.

The D input of the flip-flop 150 is provided by the non-inverting output of an RS flip-flop 155. The non-inverting output of the D flip-flop 150, shown as the signal T in FIG. 3, is supplied to the count enable line of a counter 160, while the clock input to the counter 160 is supplied by the reference oscillator 130.

Figure 4:
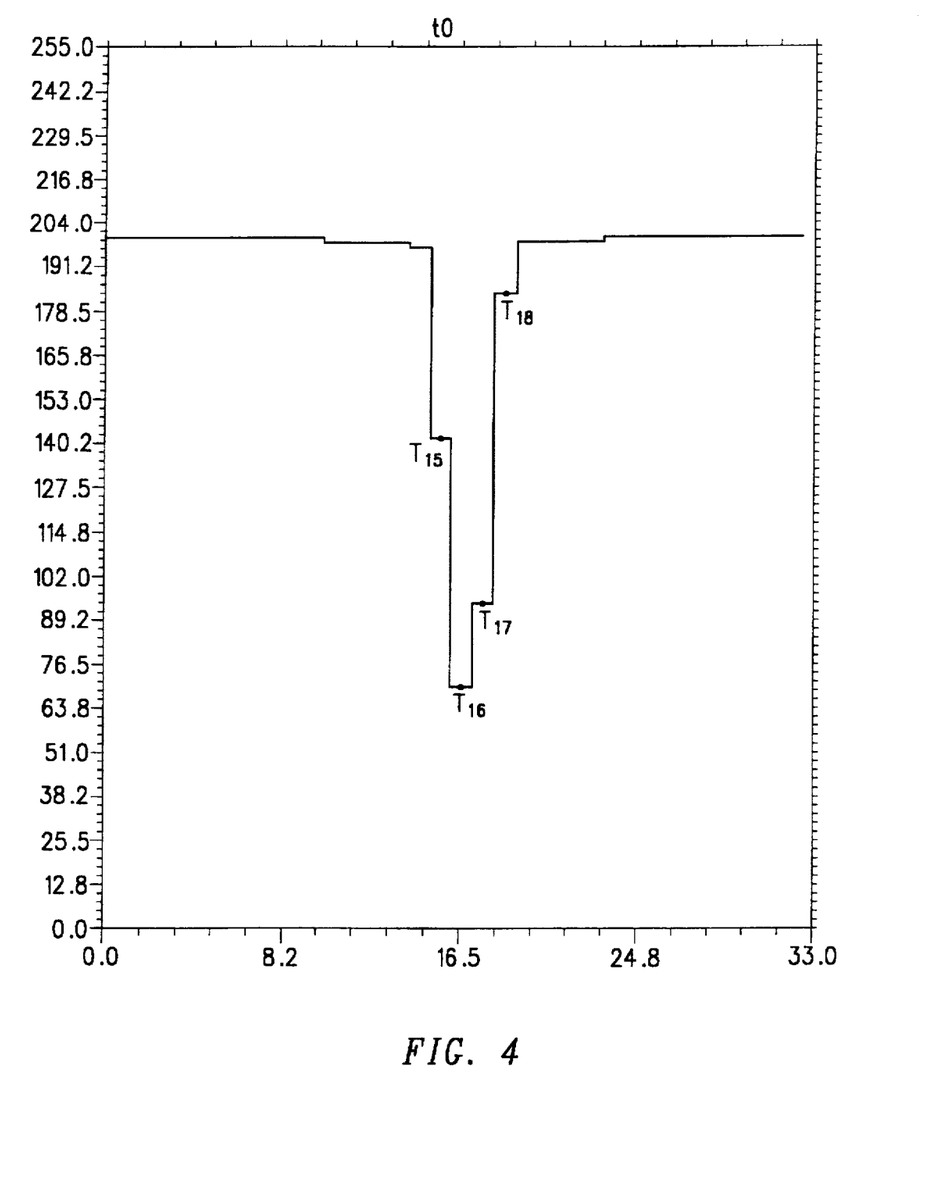
FIG. 4 shows a characteristic finger profile as might be derived from the circuit of FIG. 2.

The output of the counter 160, which represents the variation in capacitance detected by the touchpad sensor 105, is shown as the signal Q in FIG. 3 and is supplied to a microprocessor 165. The microprocessor operates on the data from each of the traces 105 to develop a finger profile, from which X,Y cursor control information may be derived. A characteristic finger profile is shown in FIG. 4. Alternatively, other control signals may be developed and generated.

In addition, the microprocessor 165 may also be used to generate calibration signals which are supplied to a digital to analog converter 170 that in turn provides adjustment signals to the reference oscillator 175. Moreover, the microprocessor 165 also supplies SET (ST) and CLEAR (CLR) signals, shown in FIG. 3, to various other components to properly initialize and sequence the operation of the circuit of FIG. 2. In particular, the ST signal provides the S input of the RS flip-flop 155, which receives the R input from the signal T at the output of the flip-flop 150. The CLR signal from the microprocessor 165 is provided to the CLR inputs of the flip-flops 145 and 150, and the counter 160.

The operation of the circuit of FIG. 2 can be best understood by following the various signals represented in the timing diagram of FIG. 3. In an exemplary embodiment, each of the traces 105 is sequentially scanned, either by being connected to oscillator components 120, or by connecting a trace 105 to an associated oscillator and then connecting a selected oscillator 125 to the remainder of the circuit at the input of the flip-flop 145. Depending on the presence or absence of a finger, the frequency of the waveform $f_T$ will vary. However, the frequency of the reference signal, $f_R$, will remain constant.

When operation is begun, a clear signal is generated to initialize the counter and the flip-flops 147 and 150. In a typical embodiment, a clear and set signal is sent each time a new trace is sampled, although other suitable approaches exist. Since the signal $f_R$ clocks the signal $f_T$ through the flip-flop 145, on the next positive-going transition of the signal $f_R$ which occurs when $f_T$ is high, the signal $f_B$ goes high. The signal $f_B$ remains high until the next rising transition of $f_R$ that occurs when $f_T$ is low, at which time $f_S$ goes low. During the time when X is low, the signal ST is generated by the MPU 165 and sets the RS flip-flop 155. The feedback from the Q output of the flip-flop 150 (the signal T in FIG. 3) to the R input of the RS flip-flop 155 causes the T output to rise on the next rising transition of the signal $f_B$, and to remain high until the following positive transition of $f_B$, when the signal T again falls. Put more simply, the signal ST is generated when $f_B$ is low, and indicates that the next measurement is enabled for one period of $f_B$.

While the signal T is high, the counter 160 counts the pulses of the waveform $f_R$, with the count beginning at the next rising transition of $f_B$ and continuing until the signal T falls. Depending on the difference in the frequencies of the signals $f_R$ and $f_T$, the number of pulses which are counted increases or decreases, giving a digital representation of the variation in capacitance of the trace caused by the presence of a user's finger. The data may then be combined with the data from the remaining traces 110 and 115 in the MPU 165 to yield a finger profile, such as is shown in FIG. 4. It will be appreciated that the finger profile of FIG. 4 does not reflect the measurements found on a single trace of the device 105, but rather reflects the data derived from sampling a number of adjacent traces. As previously mentioned, each of the traces is typically sampled either by sequentially connecting (such as by use of a multiplexer with associated multiplexer control logic) each trace to a single set of other components which, together with the trace, form an oscillator or, alternatively, associating each trace with the remaining oscillator components and multiplexing the connections between such oscillators and the flip-flop 145. It will also be appreciated that FIG. 3 illustrates the measurement for one trace, and that measurement is then repeated for each additional trace.

Figure 5:
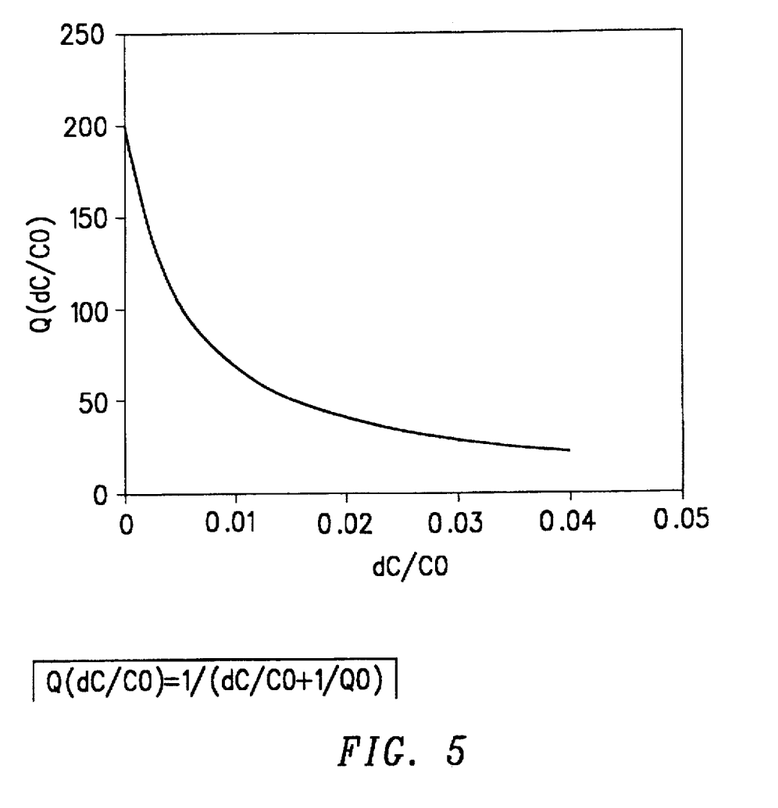
FIG. 5 is a graph showing the variation in count with the present or absence of a user's finger for an exemplary embodiment of the invention.

With reference to FIG. 5, the sensitivity of an exemplary device built in accordance with FIG. 2 can be better appreciated. In the absence of a finger or other suitable object, the count Q is adjusted to about 200. However, in the presence of a finger, the count Q drops to about 50 since the increase in capacitance resulting from the presence of a finger causes the beat frequency to rise, reducing the period during which the signal T is high. In general, $$Q = \frac{1}{\Delta C/C_o + 1/Q_o},$$

where $\Delta C$ represents the change in capacitance when a finger is present, $C_O$ is the value of the trace capacitance when no finger is present, and $Q_O$ is the count when no finger is present.

Figure 6A:
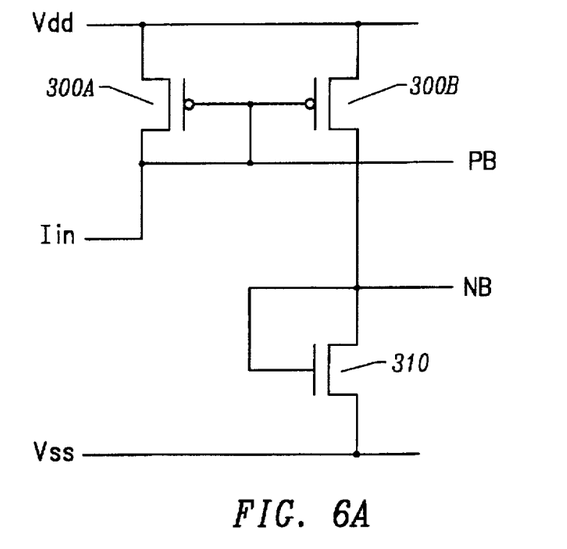
FIGS. 6A and 6B show in schematic form exemplary circuits for use as part of an oscillator in accordance with the present invention.
Figure 6B:
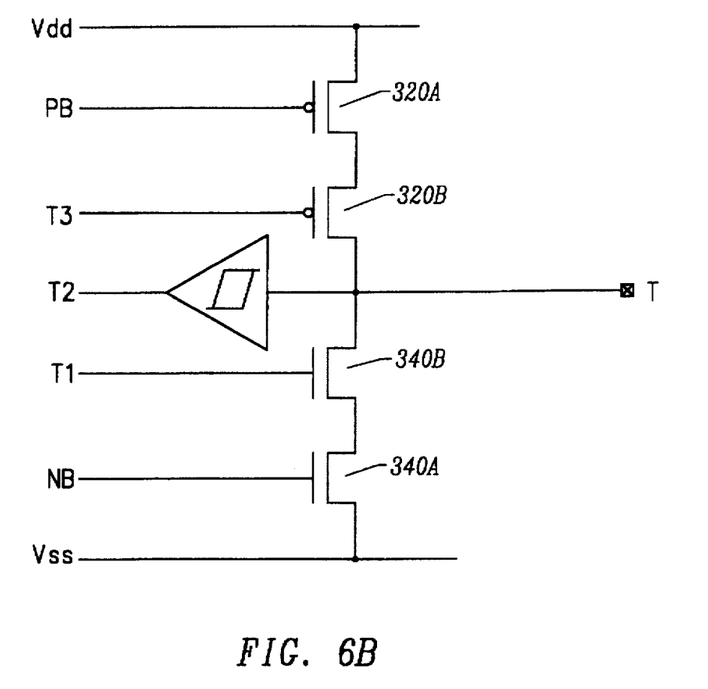

Referring next to FIGS. 6A and 6B, exemplary components 120 associated with a capacitive trace 110 or 115 are shown. In particular, the digital-to-analog converter 170 is connected to an input lin, which is connected to the drain and gate of a p-channel transistor 300A and the gate of a second p-channel transistor 300B. The sources of both transistors 300A and 300B are connected to $V_{DD}$. A third, n-channel transistor 310 has its source connected to its gate and also to the drain of the transistor 300B, while the drain of the transistor 310 is connected to $V_{SS}$. The function of the bias generator circuit of FIG. 6A is to generate bias voltages PB and NB for use in the circuit of FIG. 6B. Thus, the output PB from FIG. 6A also connects to the gate of a p-channel transistor 320A in FIG. 6B, while the source of the transistor 320A is connected to $V_{dd}$. The drain of transistor 320A is series connected to another p-channel transistor 320B, which in turn has its drain connected to a junction of the trace input T and the input to a Schmitt trigger 330. The gate of the transistor 320B is controlled by a signal T3 from the multiplexer control logic. Similarly, in the lower half of the circuit of FIG. 6B, the output NB of FIG. 6A is connected to the gate of a transistor 340A, which is connected to $V_{SS}$ at its drain but series connected to another transistor 340B at its source. The gate of the transistor 340B is controlled by a signal T1. The source of the transistor 340B is connected to the junction of the trace input T and the input to the Schmitt trigger 330. The output of the Schmitt trigger 330 is provided to a terminal T2.

Those skilled in the art will recognize that the circuit of FIG. 6B essentially forms an oscillator when connected to a trace. When a trace is enabled, the signals T1 and T3 are connected to T2 to form an oscillator, the output of which is provided at T2. When a trace is not enabled, T1 and T3 cause the transistors 320B and 3400 to turn off so the oscillator is shut down. It will be appreciated that this circuitry may also be readily implemented in a digital circuit such as an ASIC.

From the foregoing, it can be appreciated that the present invention provides a touch sensing method and apparatus with an elegantly simple approach to measuring accurately small changes in capacitance of a sensor. Importantly, the present invention permits digital implementation virtually immediately, so that all of the blocks including the microcontroller are capable of implementation in a single integrated circuit, without the yield and performance penalties associated with conventional hybrid or other circuits which attempt to combine both analog and digital circuitry in a single chip.

Figures 7A, 7B, 7C, 7D:
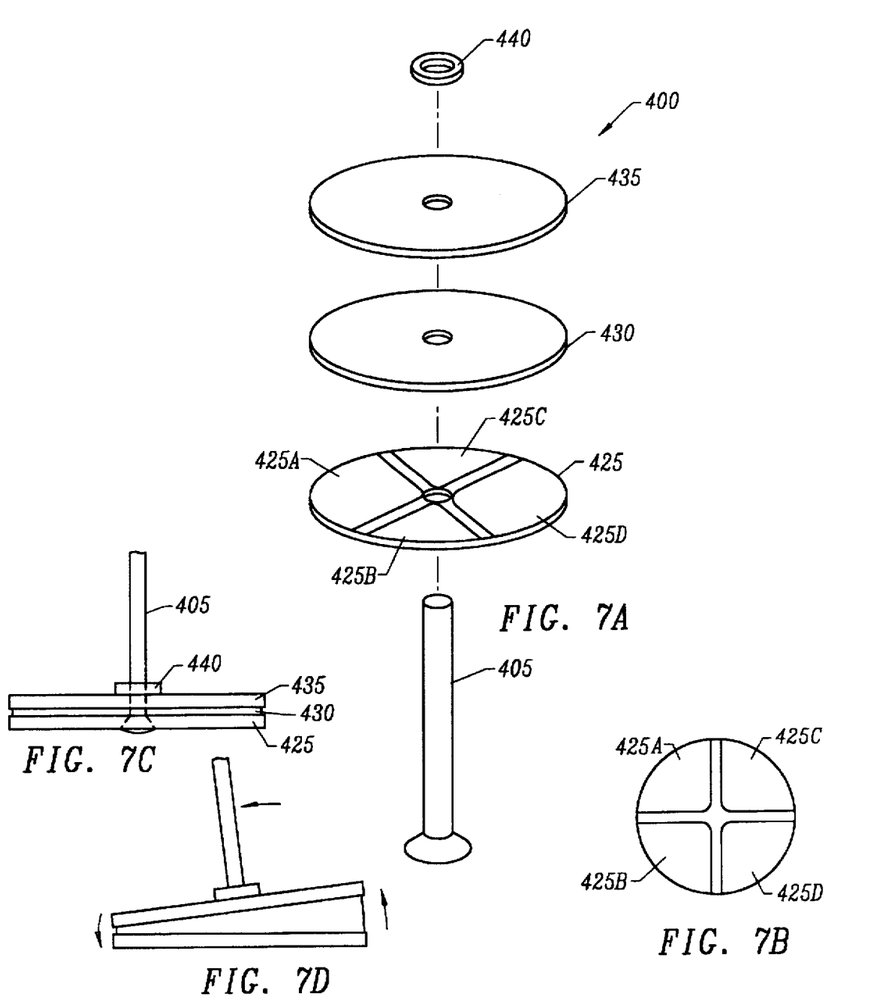
FIGS. 7A–7D illustrate one embodiment of a capacitive joystick in accordance with the present invention.

Referring next to FIGS. 7A–7D, a capacitive joystick indicated generally at 400 and capable of being used with the measurement system disclosed herein is shown in various views. In particular, in FIG. 7A such a capacitive joystick is shown in exploded perspective view, while in FIG. 7B one of the plate electrodes is shown. In FIG. 7C assembled device is shown is side elevational view, while in FIG. 7D the device is shown in side elevational view, but tilted by the application of a force to show the change in capacitance during use.

In particular, the joystick 400 includes a post 405, which extends through centrally located openings in a lower electrode 425, an insulator plate 430, an upper electrode 435, and a retainer 440. The post 405 and lower electrode 425 are configured to permit the post to tilt slightly in any angular direction without damage to the electrode 425. However, the upper electrode 435 is preferably affixed substantially rigidly to the post 405, so that tilting of the post causes the upper electrode to move out of its normal position parallel to the lower electrode. The upper portion of the post 405 may be covered by any suitable means, such as by a handle, or a plastic cover or the like, to give the appearance of a conventional joystick. One or both of the electrodes 425 and 435 includes a plurality of electrically connected portions, although the joystick will work acceptably if one of the electrodes comprises only a single segment. For the electrode having multiple sections or portions, three such portions is the practical minimum for showing motion in 360 degrees, but higher numbers of electrode sections (such as segments 425A–D in FIG. 7B) provides increasing precision. As will be apparent to those skilled in the art, the upper electrode may be electrically connected to the remaining circuitry, and this can readily be accomplished through the post 405 and/or the retainer 440. In at least some embodiments, however, the upper electrode may be allowed to float. The lower electrode(s) may be affixed to a substrate and thus connected to the remaining circuitry by any convenient means. Alternatively, the lower electrode could be allowed to float and the upper electrode connected to the remaining circuitry.

During operation, as particular seen from FIGS. 7C and 7D, the user applies a lateral force to the upper portion of the post 405, which causes the post to tilt slightly. This causes the distance between the upper electrode 435 to move away from one of the segments of the lower electrode 425 but closer to the opposite segment of the lower electrode 425, thus changing the capacitance of both segments. By appropriate measurement using, for example, a system of the type disclosed above, the change in capacitance caused by the tilting may be used to control cursor position or other pointing functions. It will also be appreciated that the post is not necessary in all embodiments, and could simply be replaced by any suitable arrangement which maintains the two plate electrodes in position relative to one another, while allowing relative tilting in response to the application of a tilting force. Thus, for example, in the absence of a post a fingertip could be applied directly to the upper electrode to provide a tilting force.

Having fully described various embodiments of the present invention, numerous alternatives and equivalents which do not depart from the invention will be apparent to those skilled in the art. It is therefore intended that the invention not be limited by the foregoing description, but only by the appended claims.

What is claimed is:

1. A method for determining the capacitance of a variable capacitor, the method comprising:

generating a subject signal having a subject frequency which varies in response to variation in the capacitance of a variable capacitor;

generating a reference signal having a reference frequency which does not vary in response to variation in the capacitance of the variable capacitor;

generating from the subject signal and the reference signal a resultant signal having a resultant frequency which is indicative of the relationship between the subject frequency and the reference frequency; and determining from the resultant frequency the capacitance of the variable capacitor, wherein the step of determining comprises:

generating from the resultant signal an adjusted resultant signal whose frequency is controlled by a control signal;

maintaining the adjusted resultant signal at a substantially constant desired frequency by manipulation of the control signal; and determining, from the control signal for which the adjusted resultant signal has the desired frequency, the capacitance of the variable capacitor.

2. The method of claim 1 wherein the resultant frequency is a function of the difference between the subject signal and the reference signal.

3. The method of claim 2 wherein the step of generating a resultant signal comprises:

mixing the subject and reference signals to form a mixed signal; and filtering the mixed signal to isolate the resultant signal.

4. The method of claim 1 wherein the resultant signal is a digital signal and further wherein the step of determining comprises:

measuring time between two state changes in the resultant signal.

5. In a touch pad for cursor control or other touch sensitive device, a method of generating a signal representative of the presence of an object such as a finger in proximity to the touch pad or other touch sensitive device comprising the steps of establishing a reference signal of a first frequency, detecting a second signal having a frequency within a predetermined range of the first frequency, which frequency changes based on the proximity of an object such as a finger to a capacitive sensor, said second signal being produced from one of a plurality of conductive lines in an array of conductive lines, mixing the first and second frequencies to develop at least a beat frequency between the first and second frequencies, and determining the beat frequency as an indicia of the change of capacitance resulting from the proximity of a finger or other object to the capacitive sensor.

6. A method for representing a change in value of a touch sensing device comprising the steps of establishing a reference signal of a first frequency, generating a sample signal of a second frequency which varies in response to a position of an object, mixing the reference and the sample signals, filtering the mixed signal to yield a beat frequency of the reference and sample signals, and monitoring the beat frequency to determine a representation of the variation in the sample signal.

7. The method of claim 6 wherein the reference signal and the sample signal are both generated by oscillators.

8. The method of claim 7 wherein the sample signal varies in accordance with the presence of a finger near the touch sensing device.

9. The method of claim 8 further including the steps of generating the sample signal by means of a variable capacitance and varying the sample signal by varying the variable capacitance.

10. The method of claim 6 wherein the mixing, filtering and monitoring are performed digitally.

11. A touch sensing device for digitally sensing variations in capacitance comprising, in a single integrated circuit:

a microcontroller for communicating with a host, means for connecting to a variable capacitance which varies in accordance with the presence of an object near the capacitance, a first digital circuit forming an oscillator when connected to said variable capacitance;

a second digital oscillator circuit for providing a reference frequency;

a digital mixer connected to said first and second digital circuits;

a digital filter connected to said mixer; and a counter connected to said digital filter.

12. In a capacitive joystick, a method of generating a signal representative of a change in capacitance comprising the steps of:

establishing a reference signal of a first frequency, detecting a second signal having a frequency within a predetermined range of the first frequency, which frequency changes based on changes in the capacitance of at least a portion of the capacitive sensor, said second signal corresponding to a position of said joystick, mixing the first and second frequencies to develop at least a beat frequency between the first and second frequencies, and determining the beat frequency as an indicia of the change of capacitance resulting from the changes in the capacitance of at least a portion of the capacitive sensor.

13. A touchpad comprising:

an array of conductive traces;

a first oscillator circuit forming an oscillator when connected to one of said conductive traces;

a coupling circuit configured to selectively connect said traces to said circuit;

a second oscillator circuit configured to provide a reference frequency;

a mixer coupled to outputs of said first and second oscillator circuits;

a filter coupled to an output of said mixer; and a counter coupled to an output of said filter.

14. The touchpad of claim 13 further comprising:

a controller; and a digital to analog converter having an input coupled to an output of said controller and an output coupled to a control input of said second oscillator.

15. The touchpad of claim 13 wherein said mixer and said filter are implemented together as a D flip-flop.

16. The touchpad of claim 13 wherein said reference frequency is on the order of 500 Khz.

17. The touchpad of claim 16 wherein a capacitance of said conductive traces is between 1 and 100 picofarads.

18. The touchpad of claim 13 wherein said circuits, mixer, filter and counter are all digital circuits.

* * * * *